United States Patent [19]
Imam et al.

[11] Patent Number: 6,054,750
[45] Date of Patent: *Apr. 25, 2000

[54] INDUCTOR FORMED AT LEAST PARTIALLY IN A SUBSTRATE

[75] Inventors: Mohamed A. Imam, Mesa, Ariz.; Sittampalam Yoganathan, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/032,430

[22] Filed: Feb. 27, 1998

Related U.S. Application Data

[63] Continuation of application No. 08/577,401, Dec. 22, 1995, Pat. No. 5,767,563.

[51] Int. Cl.[7] .................................................. H01L 29/72
[52] U.S. Cl. ......................... 257/531; 257/281; 257/379; 257/401
[58] Field of Search ................... 257/531, 281, 257/379, 401

[56] References Cited

U.S. PATENT DOCUMENTS

| | | | |
|---|---|---|---|
| 3,614,554 | 10/1971 | Shield | 257/531 |
| 4,024,565 | 5/1977 | Anthony et al. | 257/531 |
| 5,227,659 | 7/1993 | Hubbard | 257/531 |
| 5,767,563 | 6/1998 | Imam et al. | 257/531 |

*Primary Examiner*—Edward Wojciechowicz
*Attorney, Agent, or Firm*—Schwegman, Lundberg, Woessner & Kluth, P.A.

[57] ABSTRACT

A method of making an inductor and the inductor. The inductor comprises a plurality of serially connected transistors at least partially formed in a substrate, preferably a silicon on insulator substrate, and comprises a gate common to the plurality of transistors. The plurality of transistors, transistor contacts, and electrical interconnects form the coil of the inductor and the gate common to the plurality of transistors forms the core of the inductor. Two inductors of the invention are magnetically coupled to form a transformer of the invention. A control transistor is serially connected to the primary inductor of the transformer. The control transistor is gated by a periodic output signal of a ring oscillator. An actuation and a deactuation of the control transistor allows the current in the primary coil to vary creating a changing magnetic flux in the primary and secondary cores and inducing a fluctuating current in the secondary coil.

49 Claims, 9 Drawing Sheets

6,054,750

INDUCTOR FORMED AT LEAST PARTIALLY IN A SUBSTRATE

This application is a continuation of U.S. patent application Ser. No. 08/577,401, filed on Dec. 22, 1995, now U.S. Pat. No. 5,767,563.

RELATED APPLICATIONS

The following applications have been filed and may contain similar material as the present application, U.S. Ser. Nos. 08/363,145 and 08/355,750.

FIELD OF THE INVENTION

The invention relates to semiconductor devices and more particularly to an inductor formed in at least partially in a substrate of a semiconductor device.

BACKGROUND OF THE INVENTION

Transformers amplify and attenuate fluctuating voltages. A transformer is formed with at least two inductors, a primary and a secondary, lying in close proximity (magnetically coupled) to each other. Each inductor consists of a core and a coil wound around the core. When a fluctuating voltage is applied to the coil of the primary inductor, magnetic lines of flux are created in the core of the primary inductor. The magnetic lines of flux permeate the core of the secondary inductor. The changing values of the magnetic lines of flux in the secondary inductor create a time varying current in the secondary coil and hence an induced emf (electromotive force). The induced emf in the secondary coil is directly proportional to the emf in the primary coil and the ratio of the number of turns of the secondary coil to the number of turns of the primary coil.

Typically, inductors have been large and heavy since they were made using a ferromagnetic core to enhance magnetic flux. Recently, inductors have been manufactured on a semiconductor wafer. One such inductor is described in U.S. Pat. No. 3,614,554.

SUMMARY OF THE INVENTION

The invention includes an inductor partially formed in the silicon in a silicon on insulator (SOI) structure or in another type of substrate of a semiconductor structure. The inductor of the invention is formed using a plurality of serially connected transistors having a common gate. The active area of the substrate used to form each transistor functions as the inductor coil, and the gate functions as the inductor core. Preferably, the gate is connected to the DC supply potential, Vcc.

In one application the invention includes a transformer comprised of two inductors of the invention. The transformer of the invention provides voltage control in order to increase or decrease an external supply potential, Vcc. The number of turns of the primary and secondary coils of the transformer, and thus the turns ratio of the transformer, is controllable by the number of transistors used in fabricating the primary and secondary inductors of the transformer.

In one currently envisioned embodiment a control transistor is serially connected to an external supply node and the primary coil of the transformer. The external supply node is connectable to Vcc. The control transistor is actuated intermittently by an output of a ring oscillator thereby creating a pulsating current in the primary coil. The pulsating current in the primary coil creates a changing magnetic flux in the primary core which permeates the secondary core thereby producing a corresponding pulsating current in the secondary coil. The pulsating current in the secondary coil is converted to obtain a DC potential.

DETAILED DESCRIPTION OF THE PREFERRED EMBODIMENT

Figure 1A:
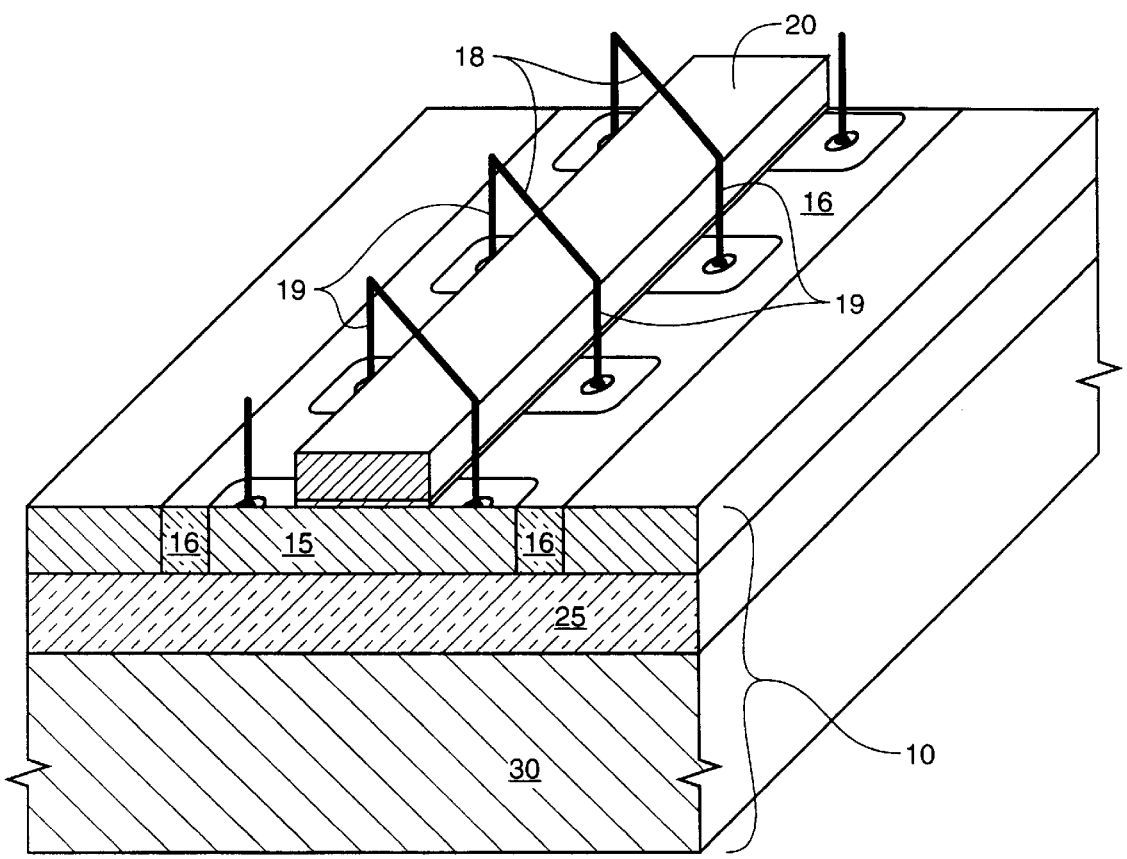
FIG. 1A is a three dimensional view of a preferred embodiment of the invention.
Figure 1B:
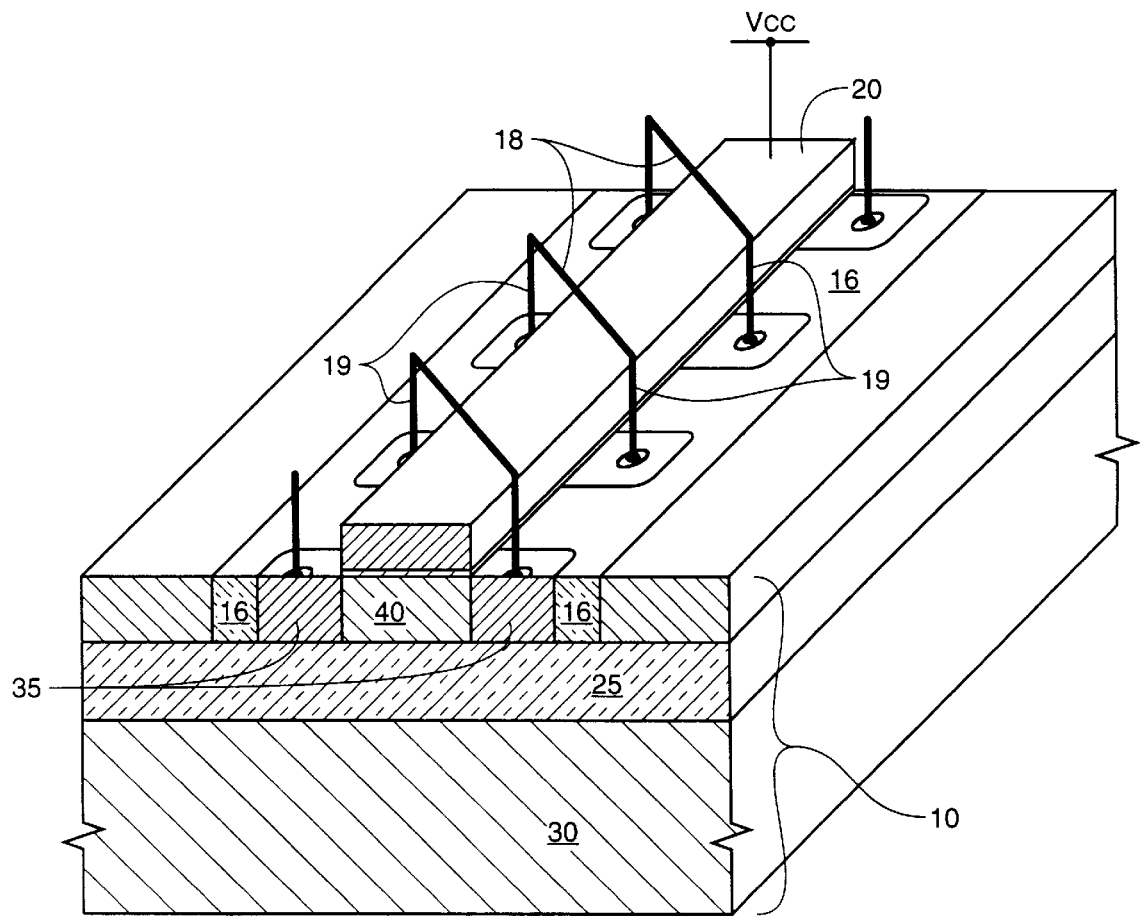
FIG. 1B is a three dimensional view of a further preferred embodiment of the invention.

The invention includes an inductor. FIGS. 1A and 1B show a three dimensional cross section of two embodiments of the invention. A plurality of MOSFET transistors 5 are fabricated using a silicon-on-insulator (SOI) MOSFET process which uses the self isolation property of the SOI 10. Active areas 15 of the substrate are doped to create low resistance regions and/or source/drain regions. A channel is formed in each active area 15 during the actuation of its respective transistor 5. The active area 15 of each transistor 5 is surrounded by an oxide or other electrically insulative material 16 to electrically isolate it from active areas 15 of other transistors 5. The MOSFET transistors 5 are connected in series by metal connections 18 formed during a deposition and etch of at least one metal layer to overlie contacts 19 formed in contact with the source/drain regions of transistors 5. When the transistors 5 are activated, current flows in the active area 15 of the substrate in each transistor 5. The serially connected MOSFET transistors 5 form the coil of the inductor of the invention. Each transistor 5 comprises one turn of the coil. The MOSFET transistors 5 share a gate 20 which forms the core of the inductor. Preferably the gate 20 is connected to Vcc. This ensures that all of the serially connected transistors 5 are activated simultaneously, and that the coil of the inductor is continuous.

In FIG. 1A the active area 15 is an n+ region overlying the oxide layer 25, which, in turn, overlies a p substrate 30. In this embodiment the entire film is opened rather than only the source/drain region. Alternately, the active area may be p– with the oxide layer 25 overlying an n type substrate. In addition other combinations used to make silicon on insulator substrates may be used. For example n+ over n, p+ over p, n+ over p, and p+ over n are a few of the options available to the designer.

In FIG. 1B the active area 15 is doped to form n+ drain and source regions 35. In this embodiment the region underlying the gate 40 is p, and a p type substrate 30 underlies the oxide layer 25. Alternatively, the drain and source regions 35 may be p+ and the regions underlying the gate 40 and underlying the oxide 25 may be n.

Figure 1C:
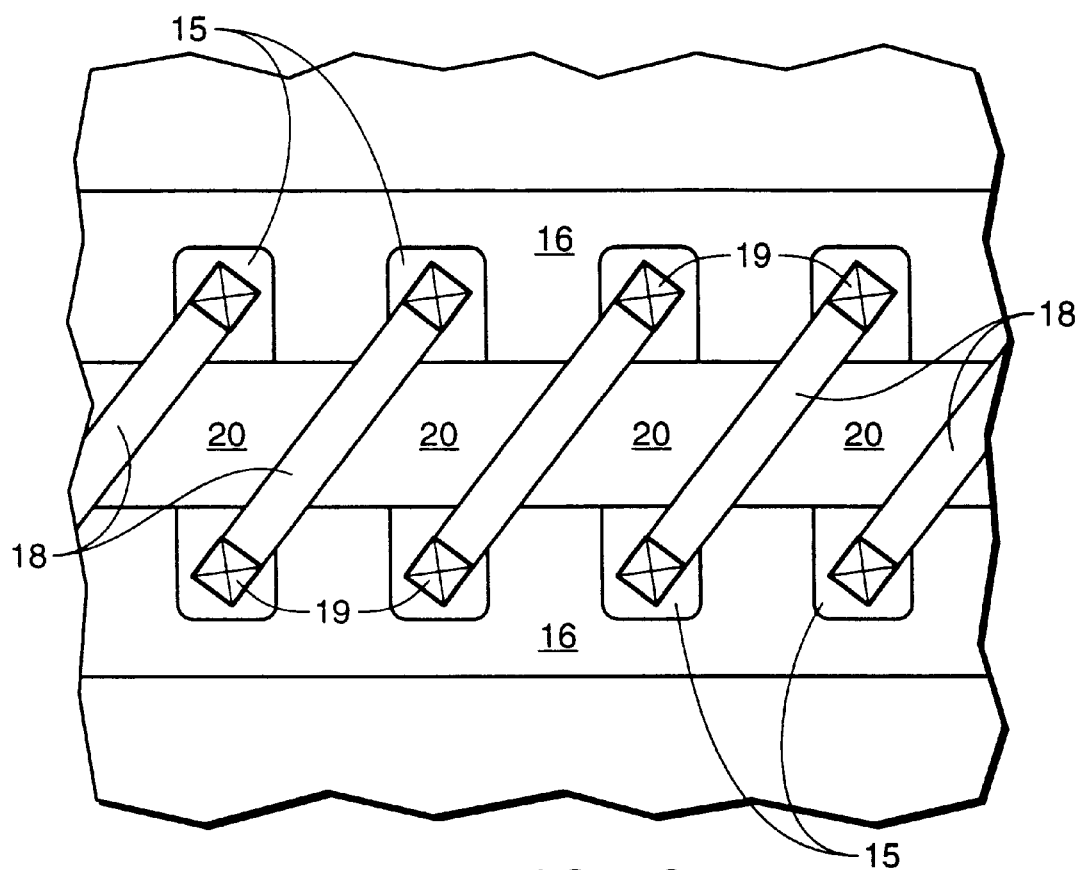
FIG. 1C is a simplified top planar view of the three dimensional views showed in FIGS. 1A and 1B.

FIG. 1C is a top planar view of the three dimensional views shown in FIGS. 1A and 1B, and the components have been numbered the same as in FIGS. 1A and 1B. A BPSG layer typically used to isolate interconnect 18 and contacts 19 from the gate is not shown in this view in order that the components of the inductor can be easily seen. A study of FIG. 1C reveals that the contacts 19, the interconnects 18 and the active regions 15 of the substrate form a conduction path around the gate 20 of the plurality of transistors, thereby allowing the gate 20 to function as a core of an inductor and allowing the conduction path formed in the plurality of active areas 15, contacts 19, and interconnects 18 to function as the coil of the inductor.

Figure 2A:
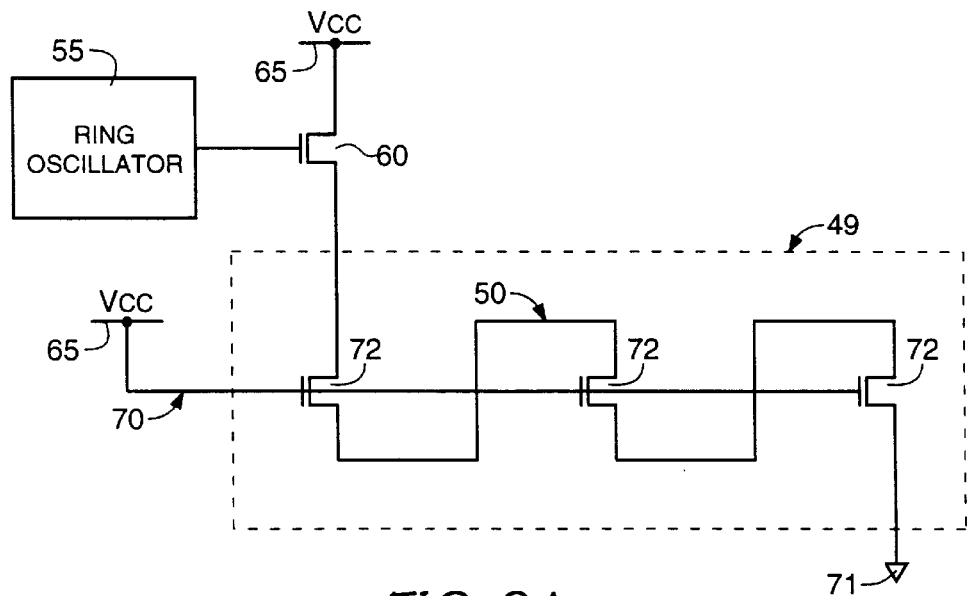
FIG. 2A is a schematic of an embodiment of the invention.

Referring now to FIG. 2A which is a schematic of one embodiment of the inductor 49 of the invention, the output signal of a ring oscillator 55 controls the actuation and deactuation of a control transistor 60 serially connected to the coil 50 and a supply node 65. The supply node 65 is connectable to the external supply potential, such as Vcc, or other DC potential. The core 70 of inductor 49 is connected to supply node 65. The core 70 is the common gate of serially connected transistors 72 which form the coil 50, and in this embodiment the gate, core 70, is continually biased when connected to a constant DC potential. The control transistor 60 actuates and deactuates in response to a periodic oscillator output potential. When the control transistor 60 is actuated serially connected transistors 72 conduct current. As the current changes in response to the actuation and deactuation of the control transistor 60 the magnetic lines of flux which permeate the core change. Thus, the change in magnetic flux is self-timed and dependent on the period and frequency of the periodic oscillator output potential.

Figure 2B:
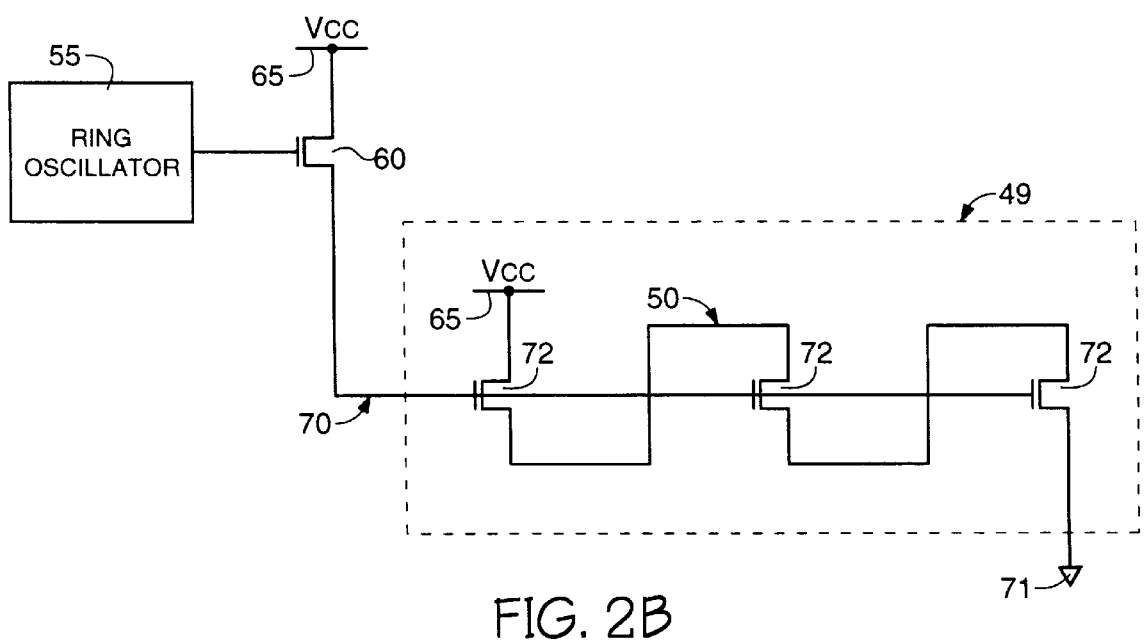
FIG. 2B is a schematic of a further embodiment of the invention.

In yet another embodiment, shown in FIG. 2B, the coil 50 of inductor 49 is connected between the supply node 65 and a reference node 71. A control transistor 60 is serially connected to supply node 65 and to the core 70 of inductor 49. The core 70 is actually the common gate of serially connected transistors 72 which form the coil 50. The periodic oscillator output potential of ring oscillator 55 controls the actuation and deactuation of the control transistor 60. When control transistor 60 is actuated the supply potential is applied to the core 70 allowing transistors 72 to actuate and allowing current to flow in coil 50. When control transistor 60 is deactuated current flow ceases in the coil. As current varies in the coil 50 the magnetic lines of flux vary in the core 70.

It is also possible to connect a fluctuating potential directly to the coil 50 or the core 70. This can be done by connecting the output node of the ring oscillator 55 directly to the coil 50 or core 70.

In an alternate embodiment the core 70 and coil 50 are both connected to fluctuating potentials and timed to allow the actuation and deactuation of transistors 72.

Figure 3:
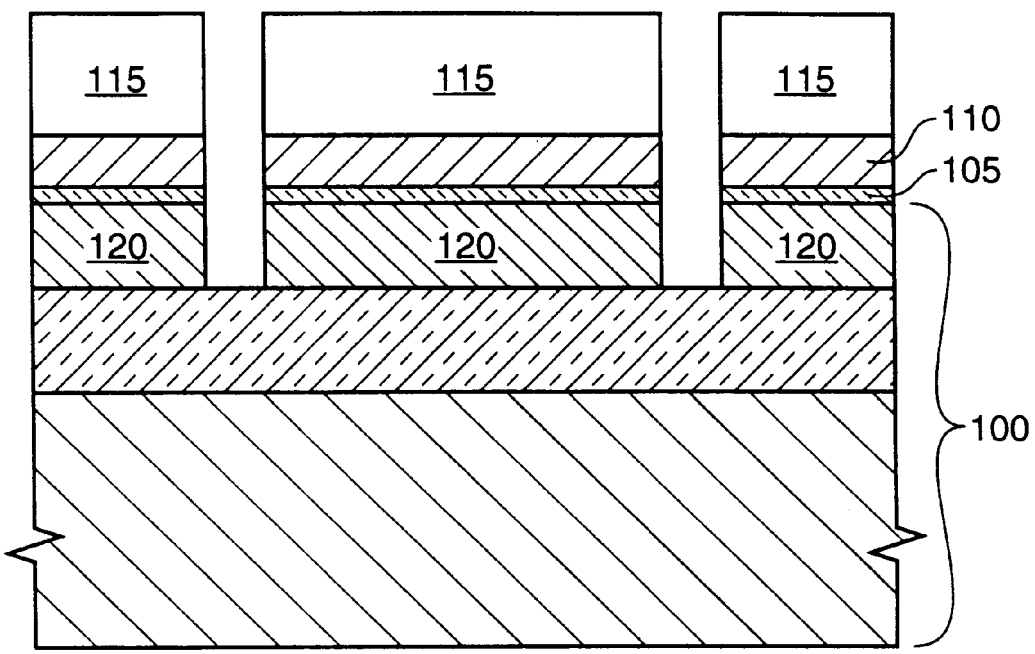
FIGS. 3–8 are cross sectional views of a method for forming the inductor of the invention.
Figure 4:
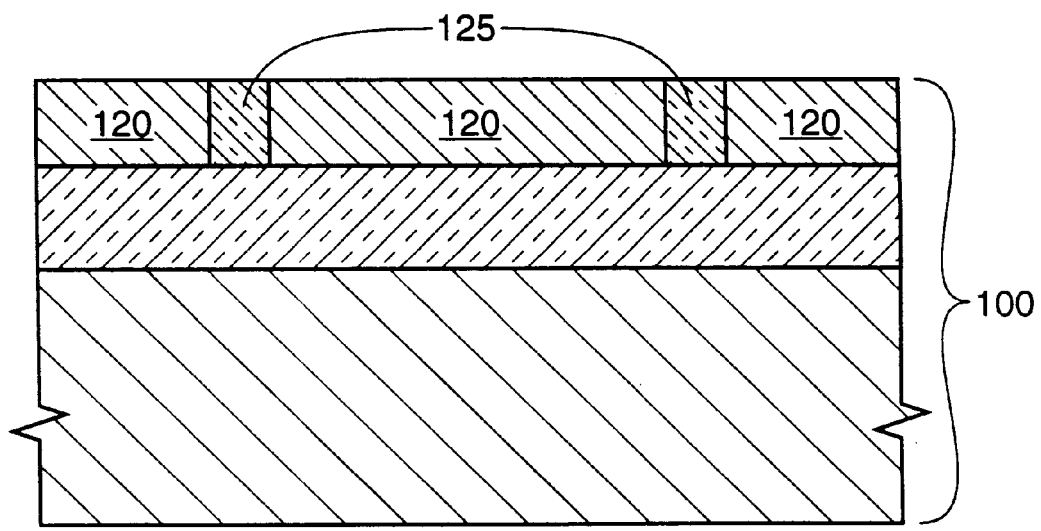

The following is one currently envisioned embodiment for making the inductor of the invention. A blanket well implant is performed on an SOI wafer 100, see FIG. 3. The implant is followed by a well drive. Next pad oxide 105 is deposited, and a nitride layer 110 is deposited overlying the pad oxide 105. Active regions are defined by a mask 115, and the nitride layer 110, the pad oxide 105, and the silicon layer 120 are removed in unmasked regions, and oxide is deposited to create isolation regions 125 in openings formed during the removal of the nitride layer 110, the pad oxide 105, and the silicon layer 120, see FIG. 4.

Alternately, only the nitride layer 110 and the pad oxide 105 are removed. In this case the silicon remaining in the unmasked region is substantially consumed during a field oxide growth to create isolation regions 125. Following the formation of the isolation regions 125 the nitride layer 110 and the pad oxide 105 are removed in the active regions.

Figure 5:
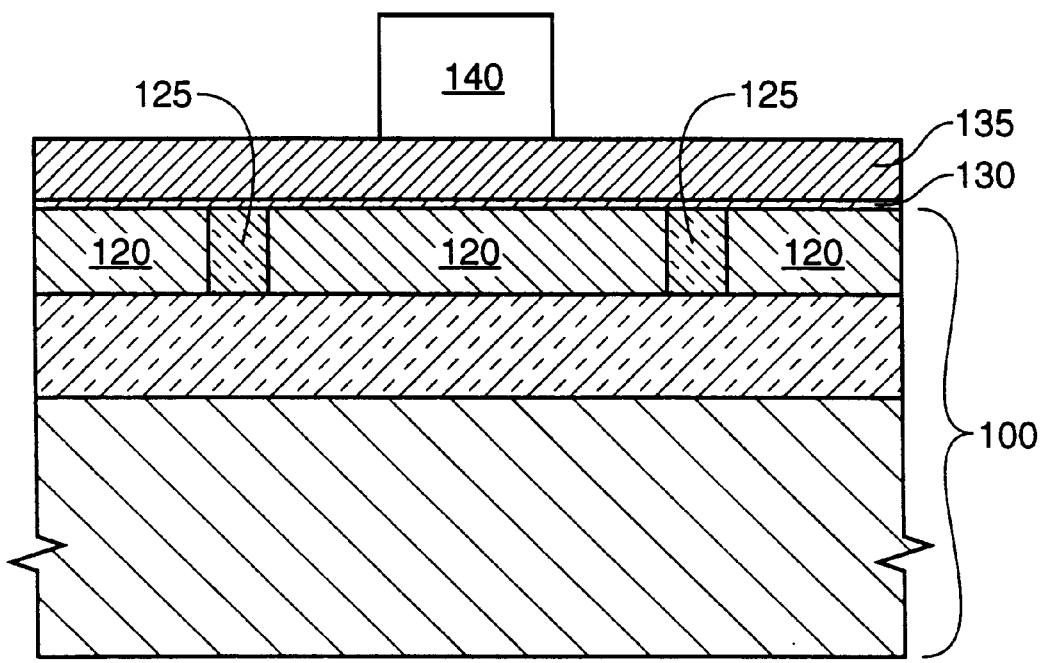

Sacrificial oxide is grown and the substrate is implanted to adjust the threshold voltage of the transistor being formed. This is referred to as a threshold voltage enhancement implant. The sacrificial oxide is then removed and gate oxide 130 is grown, see FIG. 5. Next a layer of polysilicon 135 is deposited and the gate is defined by a masking layer 140.

Figure 6:
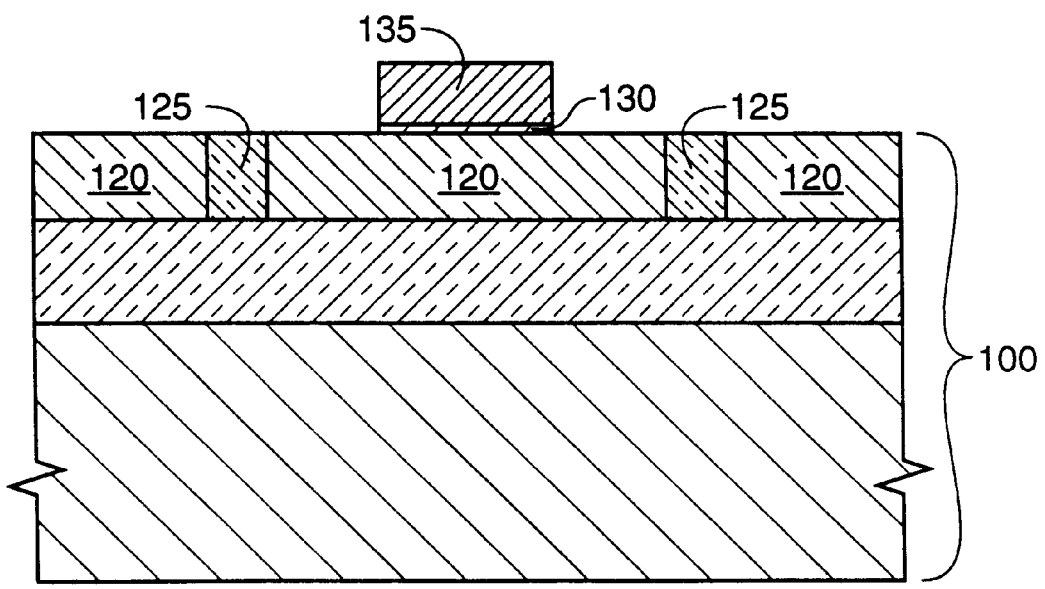

The polysilicon 135 and gate oxide 130 are removed in the unmasked regions, see FIG. 6. The polysilicon 135 remaining forms the core of the inductor of the invention and forms a transistor gate, in conjunction with the gate oxide 130, to the serially connected transistors which form the coil of the invention.

Figure 7:
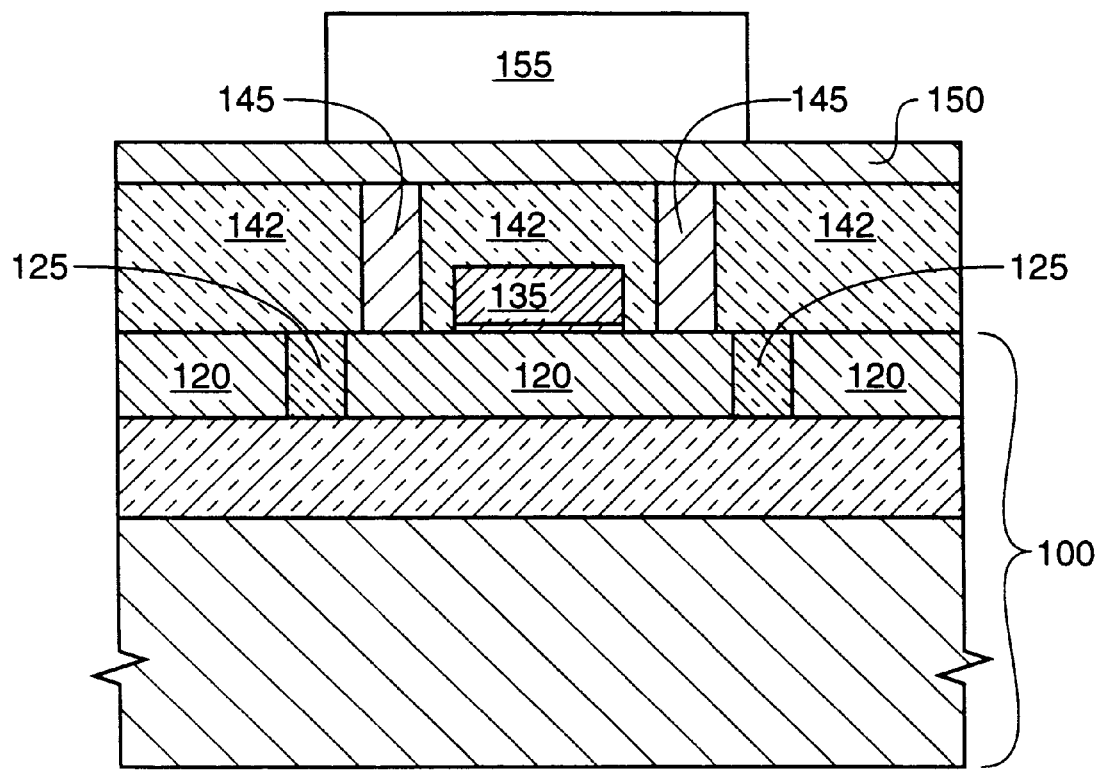

Following the formation of the gate or core a source drain implant is performed. Next BPSG 142 is formed according to conventional methods, and contacts 145 to the source/drain regions are formed in the BPSG using conventional methods, see FIG. 7. Next a metal layer 150 is deposited and masked with mask layer 155 to define interconnections between the drain and source for each two serially connected transistors of the plurality of transistors of the inductor of the invention. Please refer to FIG. 1C to enhance the interpretation of FIG. 7 three dimensionally.

Figure 8:
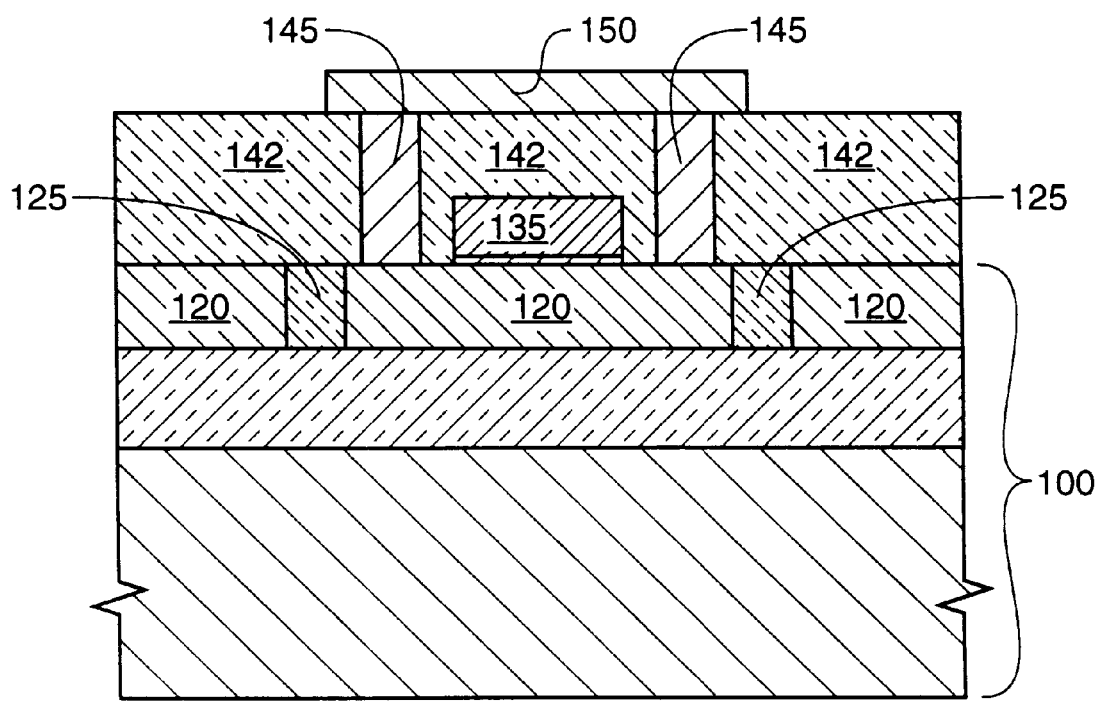

In FIG. 8 the metal layer 150 has been removed in unmasked regions, and mask 155 has been removed. Thus a conduction path is formed with the contacts, interconnects and active areas of the transistors. The conduction path surrounds the core and forms the coil of the inductor of the invention. Please refer to FIG. 1C to enhance the interpretation of FIG. 8 three dimensionally.

Figure 9:
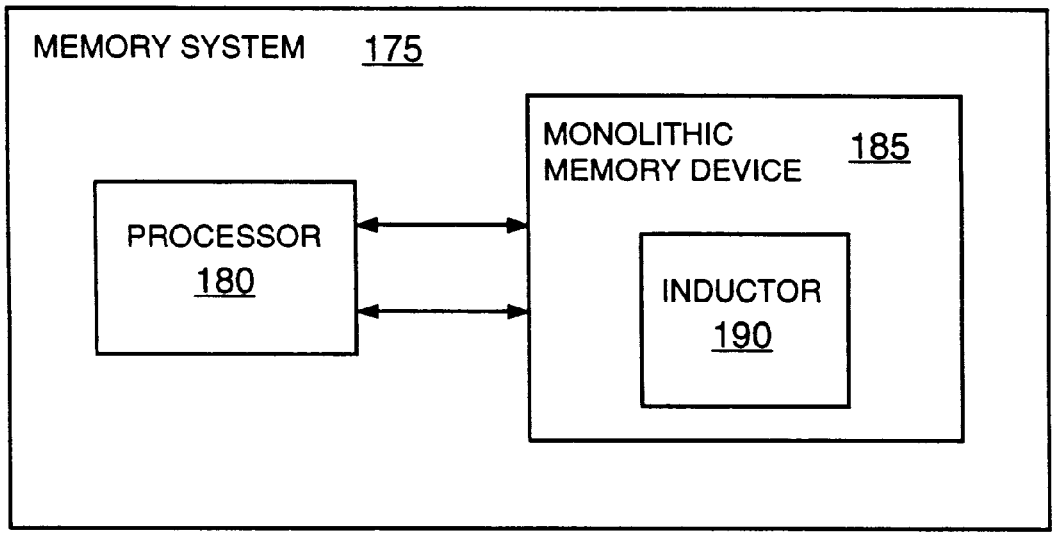
FIG. 9 is a block schematic of a memory system of the invention.

FIG. 9 is a memory system 175 of one envisioned embodiment of the invention. The memory system 175 comprises a processor 180 and a monolithic memory device 185, such as, for example, a dynamic random access memory device. Two inductors 190 of the invention, as described above, are magnetically coupled and used in the monolithic memory device 185 as a transformer to attenuate or amplify the a DC potential. The processor 180 accesses the monolithic memory device 185.

Figure 10:
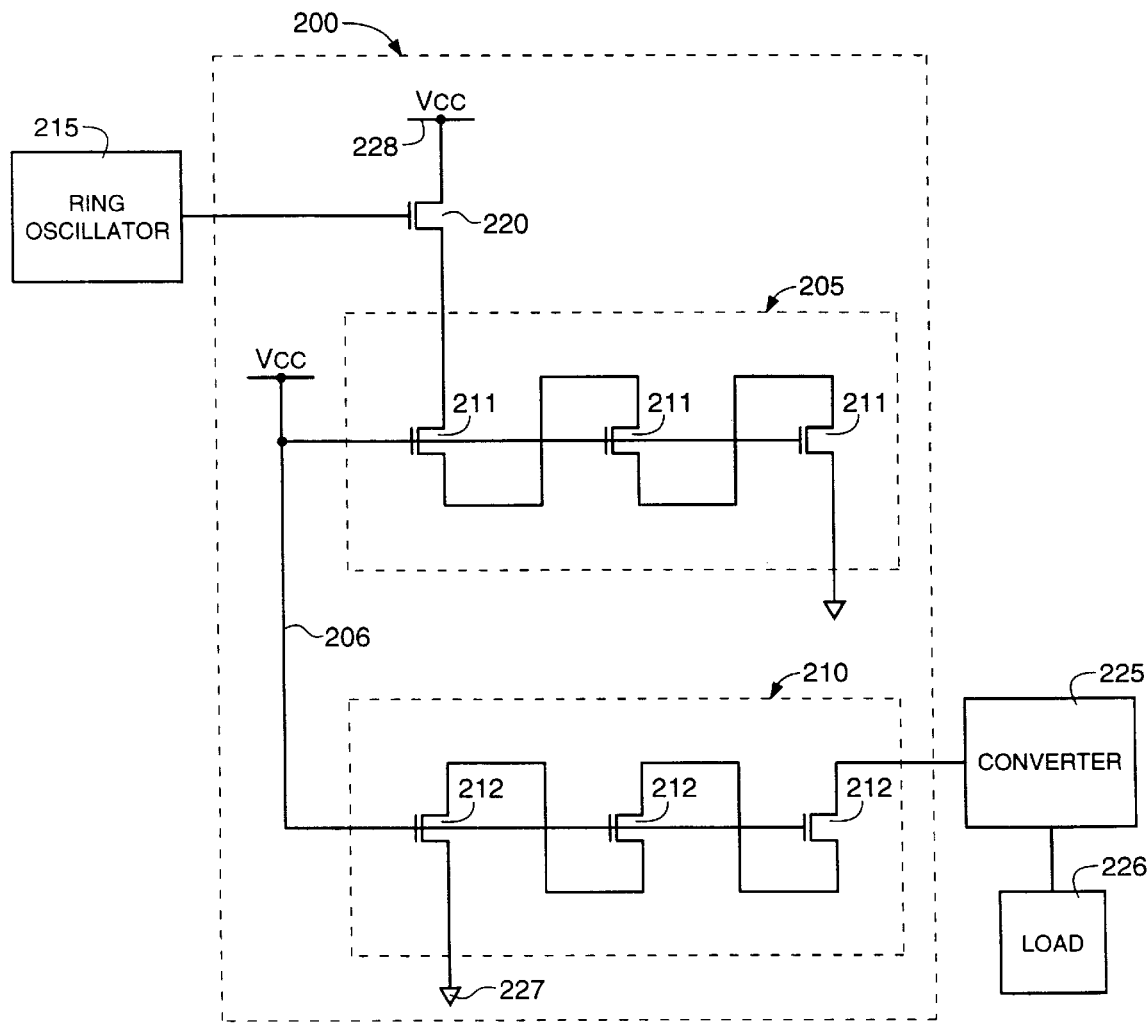
FIG. 10 is a schematic of a transformer of the invention.

FIG. 10 is a transformer 200 of the invention comprising a primary inductor 205 magnetically coupled by way of a common core 206 to a secondary inductor 210 of the invention. It can be seen from the schematic that the common core 206 is a gate common to transistors 211 and 212 which form the primary and secondary coils, respectively. By studying the schematic it can be seen that a mask having the shape of an annular ring can be used to fabricate the common core 206 of the transformer 200. Although one common gate has been shown in FIG. 10, it is also possible to fabricate the transformer wherein the cores of the primary and secondary inductors are physically separated. The periodic output of ring oscillator 215 controls the actuation and deactuation of control transistor 220 to generate a fluctuating current in transistors 211. Varying magnetic lines of flux are created in the primary inductor 205 in response to the fluctuating current generated in the primary inductor 205. The varying magnetic lines of flux permeate the secondary inductor 210 inducing a fluctuating current in the secondary inductor 210. A fluctuating potential is generated in the secondary inductor in response to the fluctuating current. A converter circuit 225 converts the fluctuating potential to a constant DC potential. This DC potential drives load 226, typically internal circuitry of a monolithic memory device. Thus, the transformer 200 attenuates, when the number of transistors 212 is less than the number of transistors 211, or amplifies, when the number of transistors 212 is greater than the number of transistors 211, the DC supply potential to internal circuitry of a monolithic memory device. In FIG. 10 the transistors 212 are electrically interposed between the converter circuit 225 and a reference potential at node 227. Alternately node 227 can be connected to a DC potential, such as Vcc. In either case the fluctuating potential generated in the secondary coil is superimposed on the value of the potential applied to node 227.

In addition, the designer or engineer skilled in the art can orient the coils in such a way to control the polarity of the output signal. Pages 398–423 and 694–700 of *Basic Electronics*, sixth edition, by Bernard Grob, McGraw-Hill Book Company are herein incorporated by reference.

In a further embodiment only one inductor of the invention is be used in combination with another type of inductor to form a transformer of the invention.

Although the invention has been described in preferred embodiments the invention should be limited only as claimed.

What is claimed is:

1. An inductor formed at least partially in a semiconductor base layer, the inductor comprising:
    a core fabricated from a gate, said core having a length and operably coupled to the base layer; and
    a coil comprising a plurality of alternating serially connected active areas and metal connections, said coil partially formed within an active area of said base layer and traversing at least a portion of the length of the core.

2. The inductor as specified in claim 1, wherein said coil comprises a conduction path formed by a plurality of transistors.

3. The inductor as specified in claim 2, wherein each of said transistors comprises a channel formed in said active of said base layer.

4. The inductor as specified in claim 2, wherein said core is a transistor gate common to said plurality of transistors.

5. The inductor as specified in claim 4, wherein said transistor gate overlies the base layer.

6. An inductor, comprising:
    at least one transistor having a gate, source and drain fabricated on a semiconductor substrate;
    a coil including the source, the drain, and a conductor, the conductor coupled to the source and drain; and
    a core operably coupled to the gate, wherein said coil extends around said core.

7. The inductor as specified in claim 6, wherein said coil comprises a conduction path formed by a plurality of serially connected transistors having said core as a common gate.

8. The inductor as specified in claim 7, wherein a portion of each transistor of said plurality of serially connected transistors is formed in an active area of substrate.

9. An inductor having a core and a coil traversing the core, comprising:
    a plurality of serially connected transistors, each transistor having a source and drain region, wherein the source of one transistor is operably coupled by a conductive material to the drain of another transistor; and
    a transistor gate, said plurality of serially connected transistors sharing said transistor gate, wherein the core comprises said gate, and wherein the coil comprises a conduction path comprising a channel region of each of said transistors of said plurality of serially connected transistors in series with the conductive material.

10. The inductor as specified in claim 9, wherein the conduction path in each transistor of said plurality of serially connected transistors is formed in an active area of a semiconductor device substrate.

11. The inductor as specified in claim 9, further comprising a plurality of interconnects, each of said interconnects connecting a source and a drain of two serially connected transistors of said plurality of serially connected transistors, said interconnects extending on the opposite side of said gate from said channel regions.

12. The inductor as specified in claim 11, wherein the coil comprises said plurality of interconnects.

13. A semiconductor structure, comprising:
    a silicon on insulator substrate having a transistor formed therein;
    a polysilicon layer overlying the silicon on insulator substrate, said polysilicon layer electrically isolated from said substrate, said polysilicon layer configured to function as a gate of said transistor and an inductor core;
    a plurality of serially connected transistors sharing said transistor gate; and
    a conduction path formed from said plurality of serially connected transistors formed in an active area of the silicon on insulator substrate wherein the conduction path encircles the inductor core.

14. The structure as specified in claim 13, wherein said plurality of serially connected transistors function as an inductor coil formed underlying the polysilicon layer.

15. An inductor structure formed using a silicon on insulator substrate, the inductor structure comprising:
    a) a plurality of alternating serially connected active regions formed in said silicon on insulator substrate and conductive segments above said silicon on insulator substrate; and
    b) a plurality of electrically insulative regions, each of said electrically insulative regions electrically operably coupled together isolating said active regions from each other.

16. The structure as specified in claim 15, further comprising a plurality of electrical interconnects serially connecting the plurality of active regions, wherein said plurality of electrical interconnects form a further portion of said inductor coil.

17. The structure as specified in claim 16, further comprising a gate overlying said plurality of active regions, wherein said gate and said active regions form a plurality of transistors, and wherein said gate is an inductor core encompassed by said inductor coil.

18. A method of inducing current flow comprising:
    actuating a plurality of transistors, each transistor utilizing a gate portion and hav active area formed in a substrate wherein the gate portions of transistors are connected together;
    conducting current in a path encircling said gate portions in response to said step of actuating, said path comprising said active areas serially connected to each other;
    creating magnetic lines of flux in said gate portions and in a plurality of further active areas in response to conducting current in the path; and
    inducing current flow in said plurality of further active areas in response to creating magnetic lines of flux.

19. A memory system comprising:
    a monolithic memory device comprising:

a plurality of transistors each transistor having an active region and a gate region wherein the active regions of the plurality of transistors are serially connected to one another by a conduction path;

a transistor gate operably coupled to the gate regions, wherein said transistor gate functions as an inductor core, and the conduction path functions as a portion of an inductor coil and the conduction path in series with the active regions of the plurality of transistors encircles the inductor core; and a processor configured to access said monolithic memory device.

20. A transformer, comprising:

a plurality of serially connected transistors at least partially formed in a base layer, each transistor having a source and a drain and a channel region, wherein the source of one transistor is serially connected by a conductive segment located above the base layer to the drain of a subsequent transistor, said plurality of serially connected transistors forming a coil of a first inductor of the transformer;

a gate overlying the channel region of each of said transistors and within the coil, said gate forming a core of the first inductor; and a second inductor at least partially formed in the base layer, the second inductor is parallel to the first inductor and magnetically coupled to the first inductor.

21. The transformer as specified in claim 20, wherein said gate is a core of said second inductor.

22. A transformer, comprising:

a) a first plurality of serially connected transistors each having a source and a drain, wherein the source of one transistor is serially connected by a conductive segment to the drain of a next transistor, said first plurality of serially connected transistors forming a coil of a first inductor of the transformer;

b) a first gate overlying and openly coupled to a channel region of each of said transistors of said first plurality of serially connected transistors, said first gate forming a core of the first inductor wherein said core of the first inductor is within the coil of the first inductor;

c) a second plurality of serially connected transistors each having a source and a drain, wherein the source of one of the transistors is serially connected by a conductive segment to the drain of the next of the transistors, said second plurality of serially connected transistors forming a coil of a second inductor of the transformer; and d) a second gate overlying and operably coupled to a channel region of each of said transistors of said second plurality of serially connected transistors, said second gate forming a core of the second inductor within the coil of the second inductor coil of, wherein said first and said second inductors are magnetically coupled to each other.

23. The transformer as specified in claim 22, wherein said first and said second gates are physically connected.

24. The transformer as specified in claim 22, further comprising a circuit in electrical communication with said second inductor, said circuit configured to convert the potential of the secondary inductor to a constant DC potential.

25. The transformer as specified in claim 24, further comprising a control circuit configured to supply a fluctuating potential to said first inductor.

26. The transformer as specified in claim 25, further comprising an oscillator circuit configured to control said control circuit.

27. An inductor partially formed in a semiconductor base layer, the inductor comprising:

a core having a rectangular cross-section; and a coil formed partially in an active area of said base layer, said coil comprising serially connected source, drain, and channel regions of a plurality of transistors of which said core is coupled to the channel regions of the plurality of transistors to form a gate, and each of the plurality of transistors is interconnected by a conductive segment above the semiconductor base layer.

28. An inductor, comprising:

a first core comprising a first transistor gate;

a first coil comprising a first transistor channel region, wherein a first conductive element is operably coupled to the transistor channel region forming a loop around said first core;

a core comprising a transistor gate, said core electrically coupled to the first core; and a coil comprising a transistor channel region, wherein a conductive element is operably coupled to the transistor channel region forming a loop around said core, and the coil is electrically coupled to the first coil.

29. An inductor structure formed using a silicon on insulator substrate, comprising:

a plurality of active regions formed in said silicon on insulator substrate;

a plurality of electrically insulative regions, each of said electrically insulative regions electrically isolating said active regions from each other;

a plurality of electrical interconnects located above the silicon on insulator substrate and serially connecting the plurality of active regions such that one active region is serially connected to a subsequent active region, wherein said plurality of electrical interconnects and said plurality of active regions form an inductor coil; and a gate overlying said plurality of active regions, wherein said gate and said active regions and, coupling the electrically insulative regions to each other form a plurality of transistors, and wherein said gate forms an inductor core encompassed by said inductor coil.

30. An inductor formed at least partially in a semiconductor base layer, the inductor comprising:

a core fabricated from a gate, the core having a length and operably coupled to the base layer;

a coil, the coil partially formed within a plurality of active areas of the base layer and traversing at least a portion of the length of the core and the coil partially formed by a plurality of metal connections serially coupling the plurality of active areas.

31. The inductor of claim 30, wherein the core is electrically insulated from the base area.

32. The inductor of claim 31, wherein a portion of the core is separated from a semiconductor substrate by at least three insulating layers.

33. An inductor comprising:

at least one transistor having a gate, source and drain fabricated on a semiconductor substrate having an oxide layer;

a coil including the source, the drain, and a conductor, the conductor coupled to the source and drain; and a core operably coupled to the gate, wherein the coil extends around the core and the coil and the core are above the oxide layer.

34. The inductor of claim 33, wherein the one transistor is formed by a complementary metal-oxide semiconductor process.

35. The inductor of claim 33, wherein the core is electrically insulated from the gate.

36. An inductor having a core and a coil traversing the core, the inductor comprising:

a plurality of serially connected transistors, each transistor having a source and drain region surrounded by an insulative material, wherein the source of one transistor is operably coupled by a conductive material to the drain of another transistor; and a transistor gate, the plurality of serially connected transistors sharing the transistor gate, wherein the core comprises the gate, and wherein the coil comprises a conduction path comprising a channel region of each of the transistors of the plurality of serially connected transistors in series with the conductive material.

37. The inductor of claim 36, wherein the plurality of serially connected transistors is a field-effect transistor.

38. The inductor of claim 36, wherein the transistor gate is fabricated from a single layer of polysilicon.

39. A semiconductor structure, comprising:

a silicon on insulator substrate having a transistor formed therein;

a polysilicon layer overlying the silicon on insulator substrate, the polysilicon layer electrically isolated from the substrate, the polysilicon layer configured to function as a gate of the transistor and an inductor core;

a plurality of serially connected transistors sharing the transistor gate; and a conduction path formed from the plurality of serially connected transistors formed in an active area of the silicon on insulator substrate wherein the conduction path encircles the inductor core at least twice.

40. The semiconductor structure of claim 39, wherein the silicon on insulator substrate is a p-type semiconductor.

41. The semiconductor structure of claim 39, wherein the polysilicon layer has a rectangular cross-section.

42. An inductor partially formed in a semiconductor base layer, the inductor comprising:

a core having a rectangular cross-section located above an oxide layer; and a coil formed partially in an active area of the base layer, the active area surrounded by an insulative region, and the coil comprising serially connected source, drain, and channel regions of a plurality of transistors, wherein the core is coupled to the channel regions of the plurality of transistors to form a gate.

43. The inductor of claim 42, wherein the core has a rectangular top surface.

44. The inductor of claim 42, wherein the coil has a length and a conductivity and the conductivity varies along the length of the coil.

45. An inductor, comprising:

a first conductive core comprising a first metal-oxide semiconductor (MOS) transistor gate;

a first coil comprising a first MOS transistor channel region, wherein a first conductive element is operably coupled to the MOS transistor channel region forming a loop around the first core;

a conductive core comprising a MOS transistor gate, the conductive core electrically coupled to the first conductive core; and a coil comprising a MOS transistor channel region, wherein a conductive element is operably coupled to the MOS transistor channel region forming a loop around the conductive, and the coil is electrically coupled to the first coil.

46. The inductor of claim 45, wherein the first conductive core is fabricated from polysilicon.

47. The inductor of claim 46, wherein the conductive core is fabricated from a metal.

48. An inductor structure formed using a silicon on insulator substrate, comprising:

a plurality of active regions formed in an and above an oxide of the silicon on insulator substrate;

a plurality of electrically insulative regions, each of the plurality of electrically insulative regions electrically isolating the active regions from each other;

a plurality of electrical interconnects located above the silicon on insulator substrate and serially connecting the plurality of active regions such that one active region is serially connected to a subsequent active region, wherein the plurality of electrical interconnects and the plurality of active regions form an inductor coil above an insulator; and a gate overlying the plurality of active regions, wherein the gate forms an inductor core encompassed by the inductor coil.

49. The inductor structure of claim 48, wherein each of the plurality of active regions includes a drain, a source, and a channel.

* * * * *

UNITED STATES PATENT AND TRADEMARK OFFICE
CERTIFICATE OF CORRECTION

PATENT NO. : 6,054,750

DATED: April 25, 2000

INVENTOR(S): Imam et al.

It is certified that error appears in the above-identified patent and that said Letters Patent is hereby corrected as shown below:

In column 6, line 53, claim 18, delete "hav active" and insert --having an active--, therefor.

Signed and Sealed this

Twenty-second Day of May, 2001

*Attest:*

NICHOLAS P. GODICI

*Attesting Officer*  Acting Director of the United States Patent and Trademark Office